(12) United States Patent
Lo et al.

(10) Patent No.: US 11,302,842 B2
(45) Date of Patent: Apr. 12, 2022

(54) MICRO LIGHT EMITTING DIODE DEVICE AND MANUFACTURING METHOD THEREOF

(71) Applicant: PlayNitride Inc., Hsinchu County (TW)

(72) Inventors: Yu-Yun Lo, Hsinchu County (TW); Chih-Ling Wu, Hsinchu County (TW); Yi-Min Su, Hsinchu County (TW); Yen-Yeh Chen, Hsinchu County (TW); Yi-Chun Shih, Hsinchu County (TW)

(73) Assignee: PlayNitride Inc., Hsinchu County (TW)

( * ) Notice: Subject to any disclaimer, the term of this patent is extended or adjusted under 35 U.S.C. 154(b) by 58 days.

(21) Appl. No.: 16/896,226

(22) Filed: Jun. 9, 2020

(65) Prior Publication Data

US 2020/0303585 A1 Sep. 24, 2020

Related U.S. Application Data

(60) Continuation-in-part of application No. 16/396,781, filed on Apr. 29, 2019, now Pat. No. 10,833,220.
(Continued)

(30) Foreign Application Priority Data

Aug. 8, 2017 (CN) .......................... 201710669467.9
Dec. 4, 2019 (TW) ............................ TW108144232
Dec. 30, 2019 (TW) ............................ TW108148261

(51) Int. Cl.
*H01L 33/00* (2010.01)
*H01L 33/36* (2010.01)
(Continued)

(52) U.S. Cl.
CPC ...... *H01L 33/0093* (2020.05); *H01L 21/7806* (2013.01); *H01L 25/0753* (2013.01);
(Continued)

(58) Field of Classification Search
CPC .......... H01L 27/15; H01L 33/52; H01L 33/44; H01L 33/20; H01L 33/58; H01L 25/167;
(Continued)

(56) References Cited

U.S. PATENT DOCUMENTS

2010/0317132 A1* 12/2010 Rogers .................... H01L 24/83
438/27
2013/0285080 A1 10/2013 Naito et al.
(Continued)

FOREIGN PATENT DOCUMENTS

CN 101908534 12/2010
CN 106206862 12/2016
(Continued)

OTHER PUBLICATIONS

"Office Action of China Counterpart Application", dated Sep. 1, 2020, p. 1-p. 7.
(Continued)

*Primary Examiner* — Selim U Ahmed
*Assistant Examiner* — Evan G Clinton
(74) *Attorney, Agent, or Firm* — JCIPRNET

(57) ABSTRACT

A method for manufacturing a micro light emitting diode device is provided. A connection layer and a plurality of epitaxial structures are formed on a substrate, wherein the epitaxial structures are separated from each other and relative positions therebetween are fixed via the connection layer. A first pad is formed on each of the epitaxial structures. A plurality of light blocking layers are formed between the epitaxial structures, wherein the light blocking layers and the epitaxial structures are alternately arranged. Each of the epitaxial structures is bonded to a destination substrate after forming the light blocking layers. The substrate is removed to expose the connection layer. A light conversion layer is formed corresponding to each of the epitaxial
(Continued)

structures, wherein a width of the light conversion layer is greater than or equal to a distance between any two of the light blocking layers.

19 Claims, 10 Drawing Sheets

Related U.S. Application Data which is a division of application No. 15/786,564, filed on Oct. 17, 2017, now Pat. No. 10,326,045.

(51) Int. Cl.

| | |
|---|---|
| *H01L 25/16* | (2006.01) |
| *H01L 33/58* | (2010.01) |
| *H01L 33/20* | (2010.01) |
| *H01L 33/52* | (2010.01) |
| *H01L 27/15* | (2006.01) |
| *H01L 21/78* | (2006.01) |
| *H01L 25/075* | (2006.01) |
| *H01L 33/12* | (2010.01) |
| *H01L 33/44* | (2010.01) |

(52) U.S. Cl.
CPC ............ *H01L 25/167* (2013.01); *H01L 27/15* (2013.01); *H01L 33/007* (2013.01); *H01L 33/12* (2013.01); *H01L 33/20* (2013.01); *H01L 33/36* (2013.01); *H01L 33/44* (2013.01); *H01L 33/52* (2013.01); *H01L 33/58* (2013.01); *H01L 27/156* (2013.01)

(58) Field of Classification Search
CPC ......... H01L 33/36; H01L 33/005–0091; H01L 24/26–32; H01L 24/83; H01L 33/0004–0045; H01L 33/02–346
See application file for complete search history.

(56) References Cited

U.S. PATENT DOCUMENTS

| | | | |
|---|---|---|---|
| 2015/0054008 A1* | 2/2015 | Rhee | ................... H01L 25/0753 257/89 |
| 2016/0071827 A1 | 3/2016 | Hu et al. | |
| 2017/0018691 A1 | 1/2017 | Lee et al. | |
| 2017/0162552 A1 | 6/2017 | Thompson | |
| 2018/0175248 A1* | 6/2018 | Ahmed | ................... H01L 23/66 |
| 2018/0261738 A1* | 9/2018 | Cha | ......................... H01L 33/58 |
| 2019/0189495 A1 | 6/2019 | Wu et al. | |
| 2019/0363000 A1 | 11/2019 | Wu et al. | |

FOREIGN PATENT DOCUMENTS

| | | |
|---|---|---|
| TW | 201711225 | 3/2017 |
| TW | I671570 | 9/2019 |
| WO | 2016100657 | 6/2016 |

OTHER PUBLICATIONS

"Notice of Allowance of China Counterpart Application," dated Apr. 6, 2021, p. 1-p. 4.

"Office Action of Taiwan Related Application, application No. 108148261", dated Sep. 8, 2020, p. 1-p. 5.

\* cited by examiner

MICRO LIGHT EMITTING DIODE DEVICE AND MANUFACTURING METHOD THEREOF

CROSS-REFERENCE TO RELATED APPLICATION

This application is a continuation-in-part application of and claims the priority benefit of U.S. application Ser. No. 16/396,781, filed on Apr. 29, 2019, now pending, which is a divisional application of and claims the priority benefit of U.S. application Ser. No. 15/786,564, filed on Oct. 17, 2017, now patented. The prior U.S. application Ser. No. 15/786, 564 claims the priority benefit of China application serial no. 201710669467.9, filed on Aug. 8, 2017. This application also claims the priority benefit of Taiwan application serial no. 108144232, filed on Dec. 4, 2019 and Taiwan application serial no. 108148261, filed on Dec. 30, 2019. The entirety of each of the above-mentioned patent applications is hereby incorporated by reference herein and made a part of this specification.

BACKGROUND

Technical Field

The invention is related to a light emitting device and a manufacturing method thereof, and particularly to a micro light emitting diode device and a manufacturing method thereof.

Description of Related Art

When fabricating the existing micro light emitting diode structure, the light blocking structure is fabricated after transferring the micro light emitting diode structure to the temporary substrate. Since the photolithography process steps such as exposure, development and etching are required when manufacturing the light blocking structure, it is easy to damage the micro light emitting diode structure that has been transferred to the temporary substrate. In addition, when the light blocking structure is fabricated on the temporary substrate, its development and peeling effects are not good, and it is easy to cause problems of reduced structural reliability and low yield.

SUMMARY

The invention provides a micro light emitting diode device which has good reliability.

The invention provides a manufacturing method of a micro light emitting diode device which is capable of improving manufacturing efficiency and yield of rate.

The manufacturing method of the micro light emitting diode device of the invention includes the following manufacturing steps. A connection layer and a plurality of epitaxial structures are formed on a substrate, wherein the epitaxial structures are separated from each other and relative positions therebetween are fixed via the connection layer. A first pad is formed on each of the epitaxial structures, wherein the first pad and the connection layer are respectively located on two opposite sides of each of the epitaxial structures. A plurality of light blocking layers are formed between the epitaxial structures, wherein the light blocking layers and the epitaxial structures are alternately arranged. Each of the epitaxial structures is bonded to a destination substrate after forming the light blocking layers, wherein the substrate and the destination substrate are respectively disposed on the two opposite sides of the epitaxial structures. The substrate is removed to expose the connection layer. A light conversion layer is formed corresponding to each of the epitaxial structures, wherein a width of the light conversion layer is greater than or equal to a distance between any two of the light blocking layers.

In an embodiment of the invention, the manufacturing method of the micro light emitting diode device further includes before forming the light conversion layer, completely removing the connection layer, wherein the light conversion layer is directly formed on each of the epitaxial structures.

In an embodiment of the invention, the manufacturing method of the micro light emitting diode device further includes before forming the light conversion layer, partially removing the connection layer to expose a surface of each of the epitaxial structures relative to the first pad and form a plurality of connection portions corresponding the light blocking layers, respectively, wherein the light conversion layer is directly formed on the surface of each of the epitaxial structures.

In an embodiment of the invention, a ratio of a thickness of each of the connection portions to a thickness of each of the light conversion layers is between 0.5 to 1.5.

In an embodiment of the invention, the substrate is a patterned substrate, the connection layer exposed after removing the substrate is a patterned connection layer, and the light conversion layer corresponding to each of the epitaxial structures is directly formed on the patterned connection layer.

In an embodiment of the invention, the light conversion layer corresponding to each of the epitaxial structures is directly formed on the connection layer.

In an embodiment of the invention, the manufacturing method of the micro light emitting diode device further includes before forming the light conversion layer, partially removing the connection layer to expose a portion of each of the light blocking layers and form a plurality of connection portions corresponding the epitaxial structures, respectively, wherein the light conversion layer corresponding to each of the epitaxial structures is directly formed on each of the connection portions.

In an embodiment of the invention, the manufacturing method of the micro light emitting diode device further includes after forming the light blocking layers, and before bonding each of the epitaxial structures to the destination substrate, forming a first adhesive layer on the light blocking layers, wherein the first adhesive layer covers the epitaxial structures and the first pad. A first substrate is connected with the first adhesive layer, and the first substrate and the substrate are respectively located on two opposite sides of the first adhesive layer. The substrate is removed, and a second substrate is connected with the epitaxial structures via a second adhesive layer, wherein the first substrate and the second substrate are respectively disposed on the two opposite sides of the first adhesive layer. The first substrate and the first adhesive layer are removed to expose the first pad and the plurality of light blocking layers. Each of the epitaxial structures is bonded to the destination substrate, wherein the second substrate and the destination substrate are respectively disposed on the two opposite sides of the plurality of epitaxial structures. The second substrate and the second adhesive layer are removed.

The manufacturing method of the micro light emitting diode device of the invention includes the following manufacturing steps. A connection layer and a plurality of epitaxial structures are formed on a substrate, wherein the epitaxial structures are separated from each other and relative positions therebetween are fixed via the connection layer. A first pad is formed on each of the epitaxial structures, wherein the first pad and the connection layer are respectively located on two opposite sides of each of the epitaxial structures. An insulating layer is formed on a side wall surface and a bonding surface connected to each other of each of the epitaxial structures and the connection layer. A light blocking layer is formed on the insulating layer, wherein the light blocking layer expose the first pad of each of the plurality of epitaxial structures. Each of the epitaxial structures is bonded to a destination substrate after forming the light blocking layer, wherein the substrate and the destination substrate are respectively disposed on the two opposite sides of the plurality of epitaxial structures. The substrate is removed to expose the connection layer. A light conversion layer is formed corresponding to each of the epitaxial structures.

In an embodiment of the invention, the first pad of each of the epitaxial structures, the light blocking layer and the destination substrate define a cavity.

A micro light emitting diode device of the invention includes a circuit substrate, a plurality of epitaxial structures, a plurality of first pads, a plurality of light blocking layers and a plurality of light conversion layers. The epitaxial structures are disposed on the circuit substrate and separated from each other. The first pads are respectively disposed on the epitaxial structures, and each of the epitaxial structures is electrically bonded to the circuit substrate via the corresponding first pad. The light blocking layers are disposed between the epitaxial structures, wherein the light blocking layers and the epitaxial structures are alternately arranged. The light conversion layers are disposed corresponding to the epitaxial structures, wherein a width of each of the light conversion layers is greater than or equal to a distance between any two of the light blocking layers.

In an embodiment of the invention, the micro light emitting diode device further includes a plurality of connection portions, disposed corresponding to the light blocking layers.

In an embodiment of the invention, a ratio of a thickness of each of the connection portions to a thickness of each of the light conversion layers is between 0.5 to 1.5.

In an embodiment of the invention, the micro light emitting diode device further includes a connection layer, disposed on the light blocking layers and the epitaxial structures, wherein the light conversion layers are disposed on the connection layer.

In an embodiment of the invention, the connection layer is a patterned connection layer.

In an embodiment of the invention, the micro light emitting diode device further includes a plurality of connection portions, disposed corresponding to the epitaxial structures and extending to a portion of each of the light blocking layers.

In an embodiment of the invention, two opposite surfaces of each of the light blocking layers are respectively aligned with two opposite surfaces of each of the epitaxial structures.

In an embodiment of the invention, the first pads, the light blocking layers and the circuit substrate define a plurality of air spaces.

A micro light emitting diode device of the invention includes a circuit substrate, a plurality of epitaxial structures, a plurality of first pads, an insulating layer, a light blocking layer and a plurality of light conversion layers. The epitaxial structures are disposed on the circuit substrate and separated from each other. The first pads are respectively disposed on the plurality of epitaxial structures, and each of the epitaxial structures is electrically bonded to the circuit substrate via the corresponding first pad. The insulating layer is disposed on a side wall surface and a bonding surface connected to each other of each of the epitaxial structures. The light blocking layer is disposed on the insulating layer, wherein the light blocking layer expose the plurality of first pads. The light conversion layers is disposed corresponding to the epitaxial structures.

In an embodiment of the invention, the first pads, the light blocking layer and the circuit substrate define a plurality of cavities.

In summary, in the manufacturing process of the micro light emitting diode device of the invention, the relative positions of the epitaxial structures on the substrate (e.g., growth substrate) are fixed via the connection layer. Therefore, when the epitaxial structures are bonded to the circuit substrate, the pad on each of the epitaxial structures can be precisely aligned with an electrode bonding layer on the circuit substrate. Furthermore, the light blocking layers are formed before bonding the epitaxial structures to the circuit substrate. Therefore, the accuracy and stress relief during the transfer can be increased, and the light blocking layers are not needed after the transfer, which can increase the yield. In other words, the manufacturing method of the micro light emitting diode device in the invention facilitates to improve manufacturing efficiency and yield of rate, and the obtained micro light emitting diode device can have better reliability.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
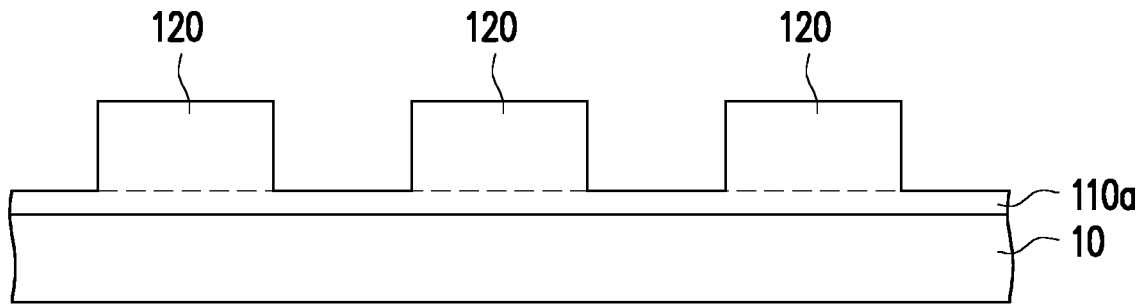
FIG. 1A to FIG. 1G are cross-sectional views illustrating a manufacturing method of a micro light emitting diode device according to an embodiment of the invention.

FIG. 1A to FIG. 1G are cross-sectional views illustrating a manufacturing method of a micro light emitting diode device according to an embodiment of the invention. First of all, referring to FIG. 1A, a connection layer 110a and a plurality of epitaxial structures 120 are formed on a substrate 10, wherein the epitaxial structures 120 are separated from each other and relative positions therebetween are fixed via the connection layer 110a. The substrate 10 may be a growth substrate such as a sapphire substrate. In the embodiment, the connection layer 110a covers one surface of the substrate 10 and connected with the substrate 10. The epitaxial structures 120 are connected with the connection layer 110a so as to fix the relative positions therebetween, and the substrate 10 and the epitaxial structures 120 are respectively located on two opposite sides of the connection layer 110a. In other words, the epitaxial structures 120 are connected with the substrate 10 via the connection layer 110a.

The step of forming the connection layer 110a and the epitaxial structures 120 separated from each other on the substrate 10 is described as follows. First of all, an epitaxial structure layer is formed on the substrate 10. Herein, the step of forming the epitaxial structure layer is described as follows. First of all, a semiconductor material layer is formed on the substrate 10, and the semiconductor material layer covers one surface of the substrate 10. The semiconductor material layer may be a multi-layered structure respectively doped with a group IIA element or a group IVA element so as to form a p-type semiconductor layer or an n-type semiconductor layer respectively. In other embodiment, the semiconductor material layer may not be doped with the group IIA element or the group IVA element; the invention provides no limitation thereto.

Subsequently, an active material layer is formed on the semiconductor material layer, and the active material layer covers one surface of the semiconductor material layer. Thereafter, the other semiconductor material layer is formed on the active material layer, and the other semiconductor material layer covers one surface of the active material layer. The semiconductor material layer and the other semiconductor material layer are respectively located on two opposite sides of the active material layer, and the other semiconductor material layer may be a multi-layered structure respectively doped with the group IIA element or the group IVA element so as form the p-type semiconductor layer or the n-type semiconductor layer. In other embodiment, the semiconductor material layer may not be doped with the group IIA element or the group IVA element; the invention provides no limitation thereto. In the embodiment, the material of the semiconductor material layer, the active material layer and the other semiconductor material layer may include a group II-VI material such as zinc selenide (ZnSe), or a group III-V material such as aluminum gallium arsenide (AlGaAs), gallium arsenide phosphide (GaAsP), aluminum gallium indium phosphide (AlGaInP), gallium aluminum phosphide (AlGaP), indium gallium nitride (InGaN), aluminum nitride (AlN), indium nitride (InN), aluminum gallium nitride (AlGaN), aluminum indium gallium nitride (AlInGaN), gallium phosphide (GaP) or gallium nitride (GaN); the invention provides no limitation thereto.

Lastly, a resist-coating process, an exposing process, a lithographing process, an etching process and so on are performed to pattern the epitaxial structure layer (i.e., the semiconductor material layer, the active material layer and the other semiconductor material layer). In other words, the epitaxial structure layer in a specific region is removed, and the portion that is not removed defines the plurality of epitaxial structures 120 separated from each other. On the other hand, in the process of removing the epitaxial structure layer in the specification region, the portion of the semiconductor layer is not removed.

Specifically, a portion of the semiconductor material layer may form the connection layer 110a, and a portion of the semiconductor material layer may form the second type semiconductor layer, and another semiconductor material layer doped with the group IIA element or group IVA element may form the first type semiconductor layer. If the portion of the semiconductor material layer forming the second type semiconductor layer is doped with the group IVA element such as silicon (Si), then the other semiconductor material layer is doped with the group IIA element such as magnesium (Mg), which should not be construed as a limitation to the invention. On the other hand, if the portion of the semiconductor material layer forming the second type semiconductor layer is doped with the group IIA element such as magnesium (Mg), then the other semiconductor material layer is doped with the group IVA element such as silicon (Si), which should not be construed as a limitation to the invention. That is to say, the first type semiconductor layer and the second type semiconductor layer may be a combination of the p-type semiconductor layer and the n-type semiconductor layer. On the other hand, the light emitting layer may be a multiple quantum well (MQW) structure formed of the active material layer.

For example, the thickness of each of the epitaxial structures 120 is, for example, 5 µm, and the thickness of the connection layer 110a is, for example, 1 µm; the invention provides no limitation thereto. It should be specifically indicated that the ratio of the thickness of the connection layer 110a to the maximum width of the epitaxial structure 120 ranges from 0.001 to 0.3. If the ratio is smaller than 0.001, the thickness of the connection layer 110a is too thin; insufficient connection force may cause the relative positions of the epitaxial structures 120 to be change in the manufacturing process. If the ratio if larger than 0.3, the thickness of the connection layer 110a is over thick, which is likely to make it difficult to partially remove the over-thick connection layer 110a. Preferably, when the maximum width of the epitaxial structure 120 is smaller than 50 µm, the ratio of the thickness of the connection layer 110a to the maximum width of the epitaxial structure 120 ranges from 0.002 to 0.2. When the maximum width of the epitaxial structure 120 is larger than or equal to 50 µm, the ratio of the thickness of the connection layer 110a to the maximum width of the epitaxial structure 120 ranges from 0.001 to 0.04.

Figure 1B:
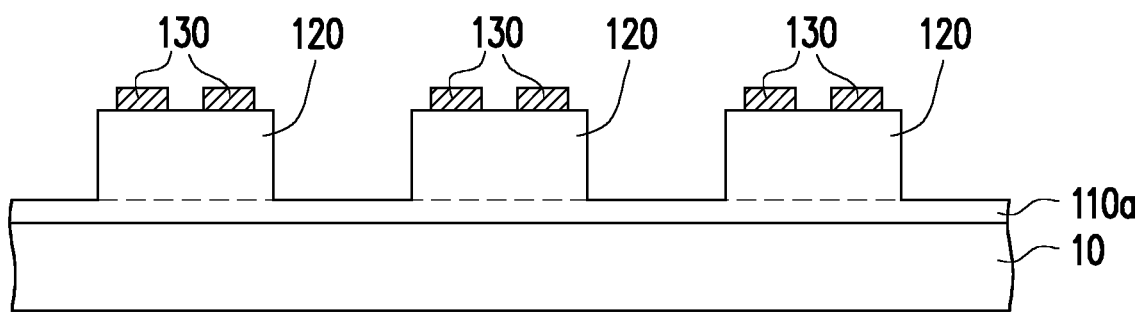

Next, referring to FIG. 1B, a first pad 130 is formed on each of the epitaxial structures 120, wherein the first pad 130 and the connection layer 110a are respectively located on two opposite sides of each of the epitaxial structures 120. In the embodiment, each of the epitaxial structures 120 can be a horizontal light emitting diode, which should not be construed as a limitation to the invention. In other embodiment not shown, each of the epitaxial structures can be a vertical light emitting diode. In the embodiment, the epitaxial structures 120 may be micro light emitting diodes (micro LED), wherein the width of each of the epitaxial structures 120 ranges from about 1 to 100 µm, and preferably ranges from about 3 to 50 µm. On the other hand, the overall thickness of each of the epitaxial structures 120 ranges from about 1 to 6 µm, the thickness that is over-thick or over-slim affects the yield of rate in the subsequent process. It should be specifically pointed out that although a cross-sectional shape of each of the epitaxial structures 120 described in the drawings is exemplified as a rectangular shape, the invention provides no limitation thereto. In other embodiment, the cross-sectional shape of the epitaxial structure may be a trapezoid shape or other geometric shape. In particular, the first pad 130 has two first pads 130, and the two first pads 130 have different electrical properties. Each of the epitaxial structures is a flip-type epitaxial structure.

Figure 1C:
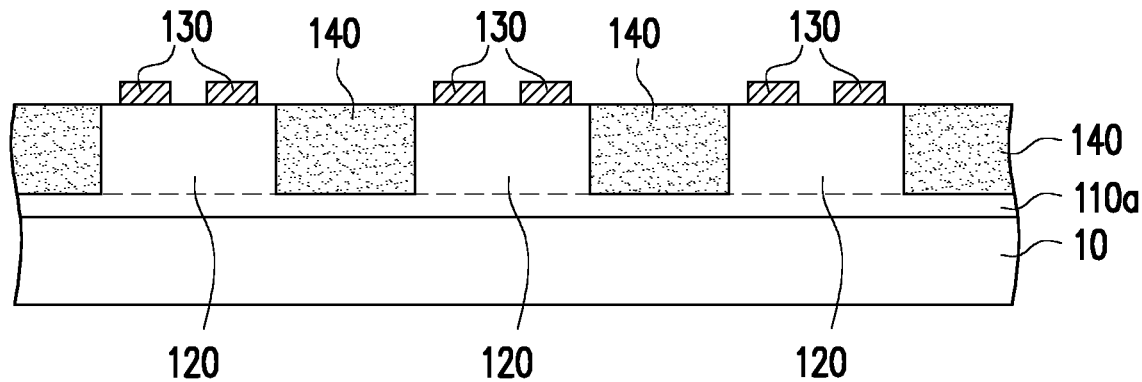

Next, referring to FIG. 1C, a plurality of light blocking layers 140 are formed between the epitaxial structures 120, wherein the light blocking layers 140 and the epitaxial structures 120 are alternately arranged. Herein, the light blocking layers 140 surround and align with the peripheries of the epitaxial structures 120. Furthermore, a material of the light blocking layers 140 includes a light reflecting material or a light absorbing material.

Figure 1D:
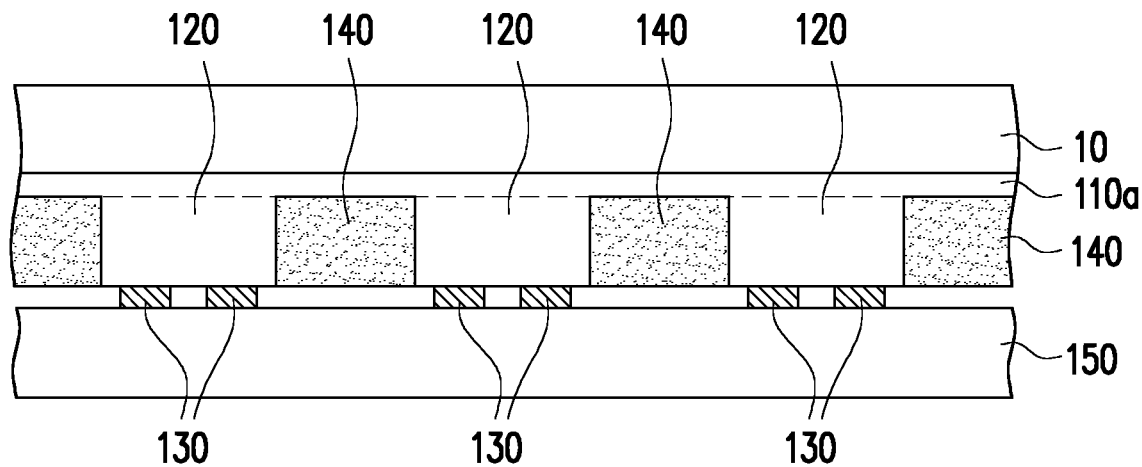

Next, referring to FIG. 1D, each of the epitaxial structures 120 is bonded to a destination substrate 150 after forming the light blocking layers 140, wherein the substrate 10 and the destination substrate 150 are respectively disposed on the two opposite sides of the epitaxial structures 120. Herein, the destination substrate 150 is a circuit substrate 150. Each of the epitaxial structures 120 is bonded to the circuit substrate 150 electrically via the corresponding first pad 130. For example, the circuit substrate 150 may be a contemporary metal oxide semiconductor (CMOS) substrate, a liquid crystal on silicon (LCOS) substrate, a thin film transistor (TFT) substrate or other substrate having a working circuit, wherein a side of the circuit substrate 150 bonded to the epitaxial structures 120 is provided with an electrode bonding layer (not shown), and each of the epitaxial structures 120 is configured to be electrically boned to the electrode bonding layer (not shown) through the corresponding first pad 130 via a flip-chip wafer-level bonding process so as to be electrically connected to the circuit substrate 150. In other embodiment, each of the epitaxial structures 120 may be electrically bonded to the electrode bonding layer on the circuit substrate 150 through the first pad 130 and a wire using a wire bonding method so as to be electrically connected to the circuit substrate 150. In other embodiment not shown, the destination substrate may also be a temporary carrier as part of the intermediate transfer process.

In the manufacturing steps described above, the relative positions of the epitaxial structures 120 are not shifted. Therefore, when the epitaxial structures 120 are transferred onto the circuit substrate 150, the first pad 130 on each of the epitaxial structures 120 can be precisely aligned with the electrode bonding layer (not shown) on the circuit substrate 150, thereby improving manufacturing efficiency and yield of rate. Furthermore, the light blocking layers 140 are formed before transferring the epitaxial structures 120 to the circuit substrate 150. Therefore, the accuracy and stress relief during the transfer can be increased, and the light blocking layers 140 are not needed after the transfer, which can increase the yield.

Figure 1E:
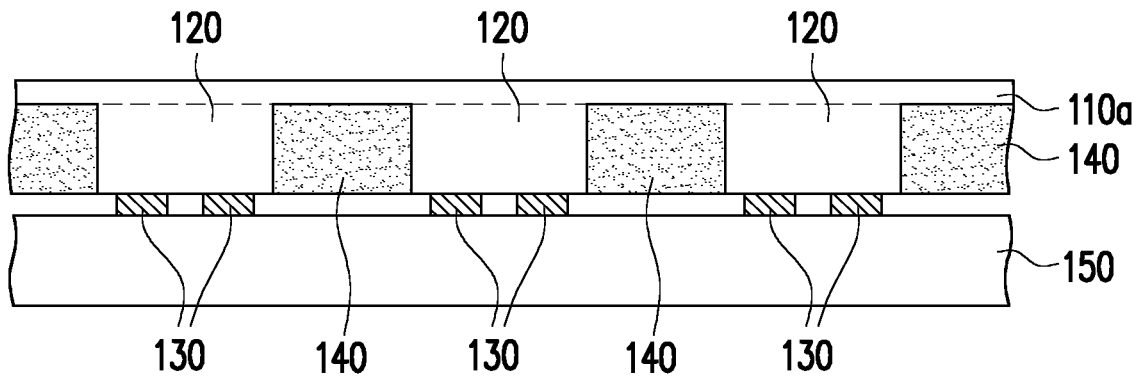

Next, referring to FIG. 1D and FIG. 1E, the substrate 10 is removed to expose the connection layer 110a. The substrate 10 may be removed via a laser lift off process or other proper removing process so as to expose a side of the connection layer 110a that is not provided with the epitaxial structures 120.

Figure 1F:
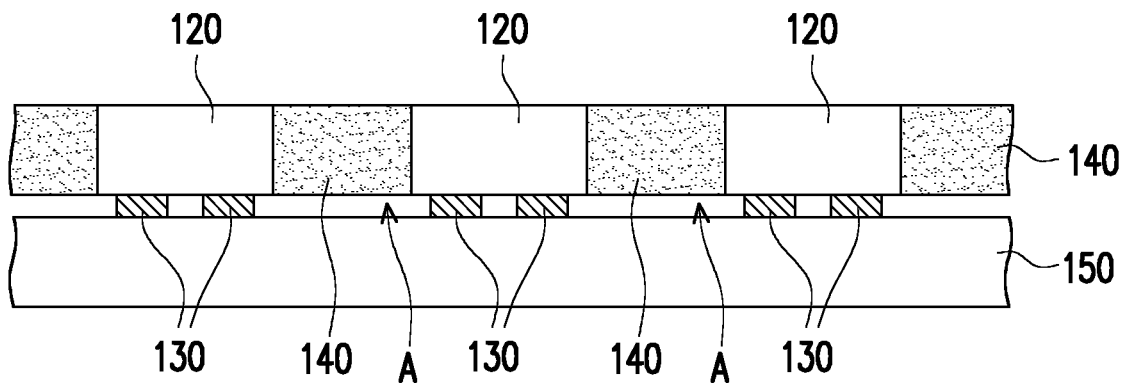

Next, referring to FIG. 1F, the connection layer 110a is completely removed via a plasma etching or other proper removing method, so as to expose the epitaxial structures 120 and the light blocking layers 140. Herein, two opposite surfaces of each of the light blocking layers 140 are respectively aligned with two opposite surfaces of each of the epitaxial structures 120. Herein, the first pads 130, the light blocking layers 140 and the circuit substrate 150 define a plurality of air spaces A, wherein the air spaces A can be used as a buffer during bonding. Lastly, referring to FIG. 1G, a light conversion layer 160 is formed corresponding to each of the epitaxial structures 120, wherein a width W of the light conversion layer 160 is greater than or equal to a distance D between any two of the light blocking layers 140. Herein, the light conversion layer 160 is directly formed on each of the epitaxial structures 120, and the width W of the light conversion layer 160 is equal to the distance D between any two of the adjacent light blocking layers 140. At this point, the manufacturing method of the micro light emitting diode device 100a is completed.

Figure 1G:
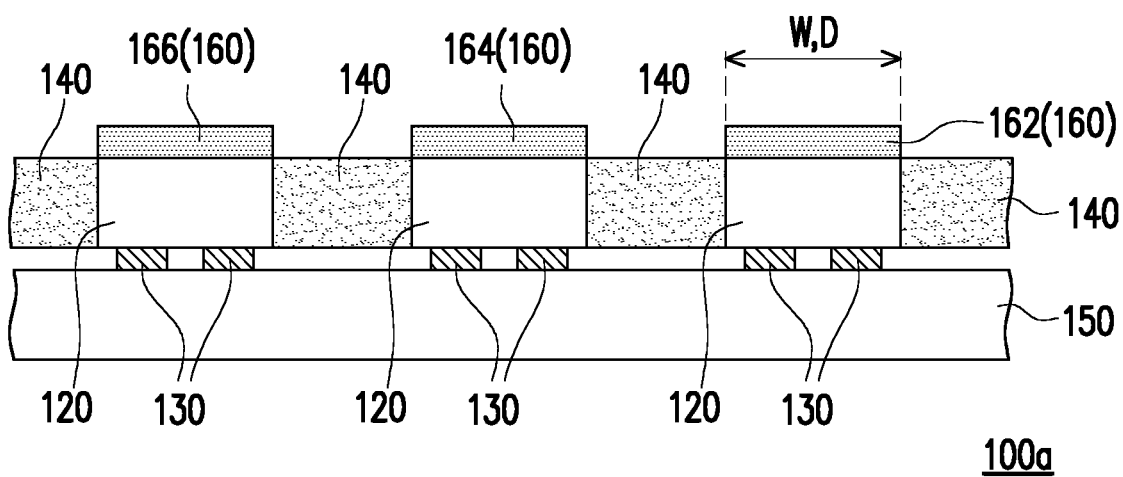

In terms of structure, further referring to FIG. 1G, the micro light emitting diode device 100a includes the circuit substrate 150, the epitaxial structures 120, the first pads 130, the light blocking layers 140 and the light conversion layers 160. The epitaxial structures 120 are disposed on the circuit substrate 150 and separated from each other. The first pads 130 are respectively disposed on the epitaxial structures 120, and each of the epitaxial structures 120 is electrically bonded to the circuit substrate 150 via the corresponding first pads 130. The light blocking layers 140 are disposed between the epitaxial structures 120, wherein the light blocking layers 140 and the epitaxial structures 120 are alternately arranged. The light conversion layers 160 are disposed corresponding to the epitaxial structures 120, wherein the width W of each of the light conversion layers 160 is greater than or equal to the distance D between any two of the adjacent light blocking layers 140. In particular, the conversion layers 162, 164 and 166 are separated from each other and can have different light colors, such as red, green, blue or a combination thereof. In other embodiment not shown, the light conversion layers 160 can also be dispose on only part of the epitaxial structures 120. For example, the epitaxial structures 120 can emit blue wavelengths, and the light conversion layers 160 with red and green, respectively, can be disposed on the epitaxial structures 120 that need to convert light colors to form RGB three colors for display.

In short, in the manufacturing process of the micro light emitting diode device 100a of the embodiment, the relative positions of the epitaxial structures 120 on the substrate 10 (e.g., growth substrate) are fixed via the connection layer 110a. Therefore, when the epitaxial structures 120 are bonded to the circuit substrate 150, the first pad 130 on each of the epitaxial structures 120 can be precisely aligned with the electrode bonding layer on the circuit substrate 150. Furthermore, the light blocking layers 140 are formed before bonding the epitaxial structures 120 to the circuit substrate 150. Therefore, the accuracy and stress relief during the transfer can be increased, and the light blocking layers 140 are not needed after the transfer, which can increase the yield. In other words, the manufacturing method of the micro light emitting diode device 100a in the present embodiment facilitates to improve manufacturing efficiency and yield of rate, and the obtained micro light emitting diode device 100a can have better reliability.

It should be noted here that the following embodiments follow the device numbers and partial contents of the foregoing embodiments, where the same reference numbers are used to indicate the same or similar devices, and the description of the same technical contents is omitted. For the description of the omitted parts, reference may be made to the foregoing embodiments, and the following embodiments will not be repeated.

FIG. 2A to FIG. 2G are cross-sectional views illustrating some steps of a manufacturing method of a micro light emitting diode device according to another embodiment of the invention. In the manufacturing process, subsequent to the step of FIG. 1C, referring to FIG. 2A, a first adhesive layer 20 is formed on the light blocking layers 140 via a spin-coating process or other proper method, wherein the first adhesive layer 20 covers the epitaxial structures 120 and the first pad 130. Herein, the material of the first adhesive layer 20 is, for example, a polymer.

Next, referring to FIG. 2A again, a first substrate 30 is connected with the first adhesive layer 20, and the first substrate 30 and the substrate 10 are respectively located on two opposite sides of the first adhesive layer 20. Since the relative positions of the epitaxial structures 120 separated from each other on the substrate 10 can be fixed via the connection layer 110a, when the first substrate 30 is adhered to the first adhesive layer 20, if the first adhesive layer 20 becomes deformed when being subjected to heat and force during the bonding process, then the relative positions of the epitaxial structures 120 are not shifted due to the effect of the first adhesive layer 20. It should be specifically pointed out that the first substrate 30 and the substrate 10 may be selected from materials having similar thermal expansion coefficient, for example, both of them may be a sapphire substrate, thereby reducing the effect of deformation caused by the difference in thermal expansion coefficient during the bonding process.

Figure 2A:
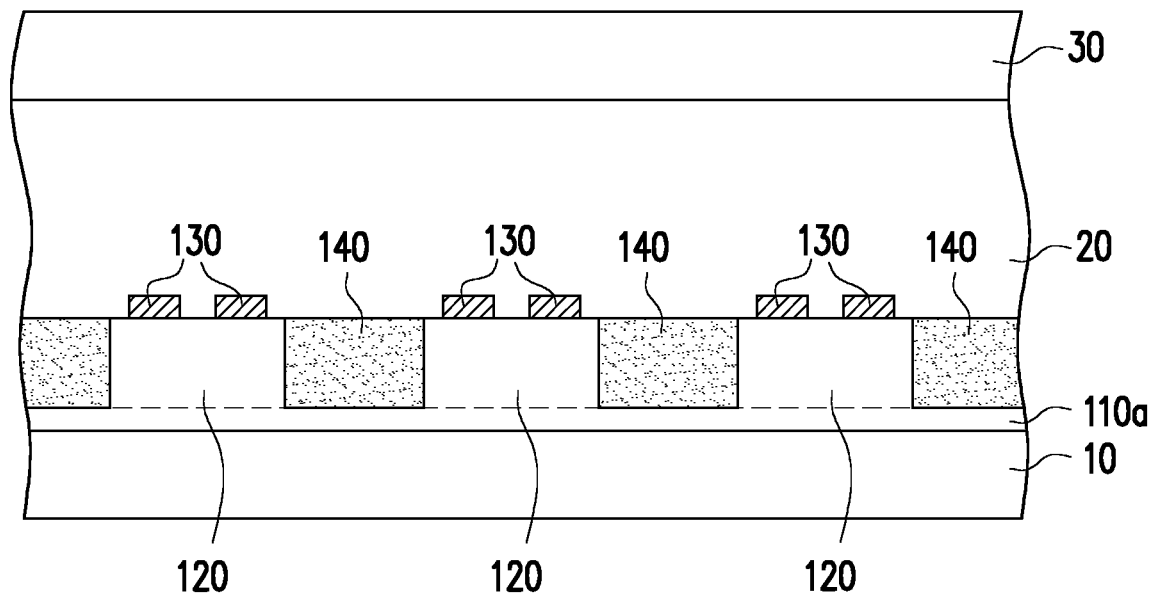
FIG. 2A to FIG. 2G are cross-sectional views illustrating some steps of a manufacturing method of a micro light emitting diode device according to another embodiment of the invention.
Figure 2B:
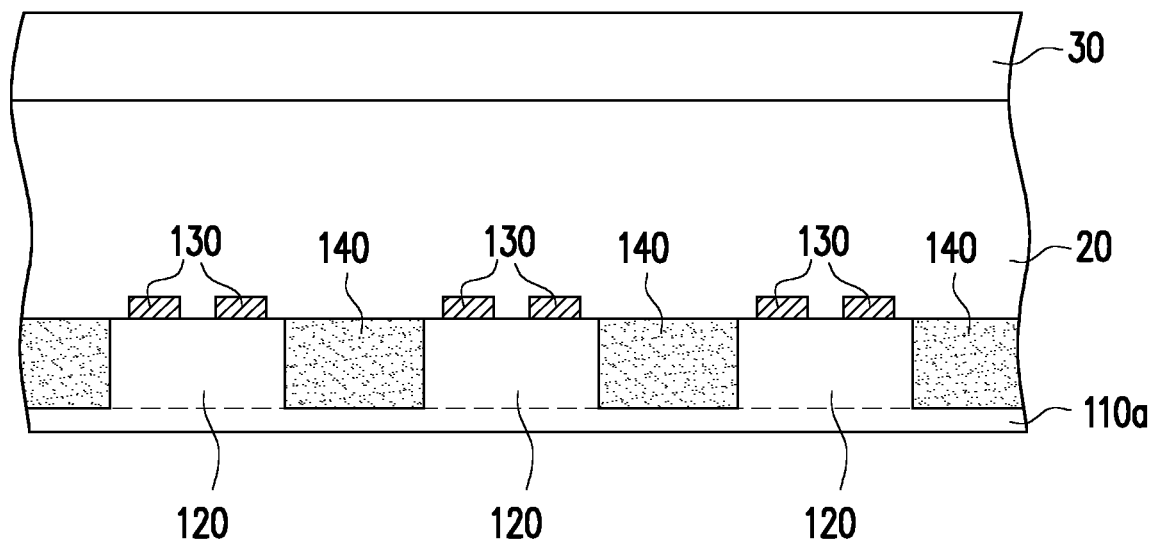

Next, referring to FIG. 2A and FIG. 2B, the substrate 10 is removed via a laser lift off process or other proper removing process so as to expose a side of the connection layer 110a that is not provided with the epitaxial structures 120.

Figure 2C:
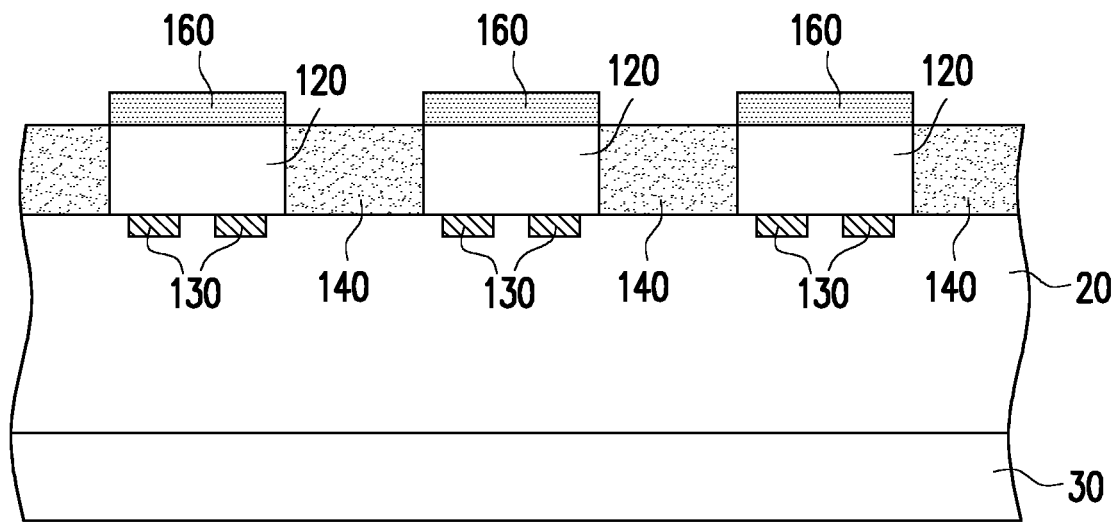

Next, referring to FIG. 2C, the connection layer 110a is completely removed via a plasma etching or other proper removing method, so as to expose the epitaxial structures 120 and the light blocking layers 140. Immediately after, referring to FIG. 2C again, the light conversion layer 160 is formed corresponding to each of the epitaxial structures 120.

Figure 2D:
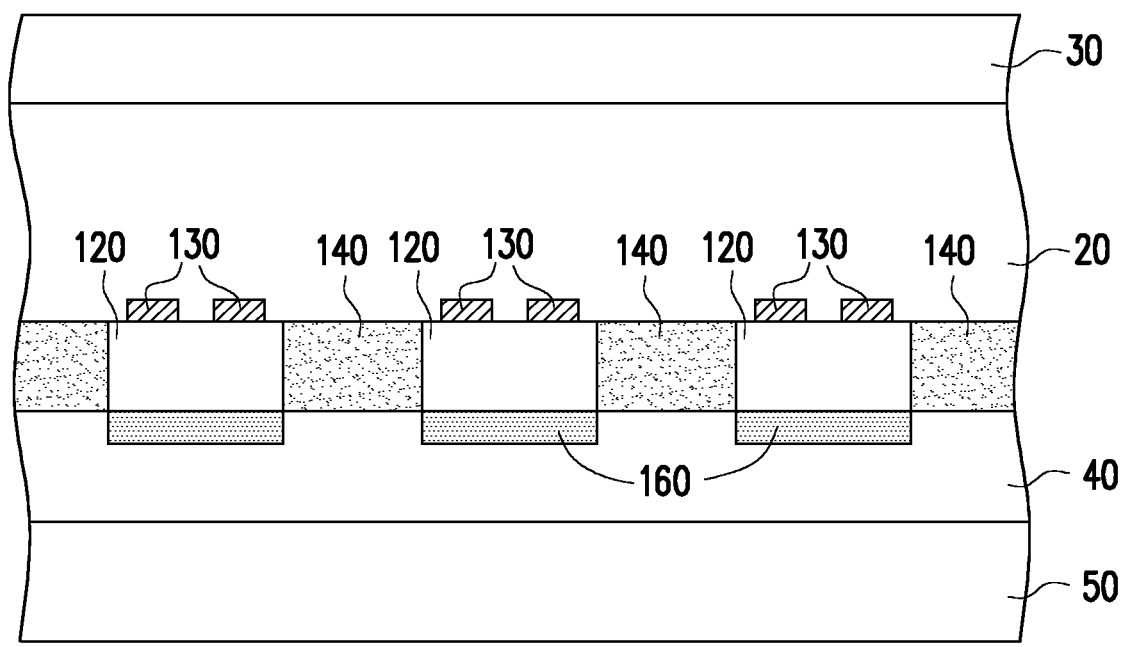

Next, referring to FIG. 2D, a second adhesive layer 40 may be formed on the connection layer 110a via a spin-coating process or other proper method, and a second substrate 50 is connected with (or adhered to) the second adhesive layer 40. That is to say, the second substrate 50 is connected with the epitaxial structures 120 and the light conversion layer 160 via a second adhesive layer 40, wherein the first substrate 30 and the second substrate 50 are respectively disposed on the two opposite sides of the first adhesive layer 20. Herein, the material of the first adhesive layer 20 is, for example, a polymer. Since the relative positions of the epitaxial structures 120 separated from each other can be fixed by the connection layer 110a, when the second substrate 50 is connected with the connection layer 110a via the second adhesive layer 40, even if the first adhesive layer 20 is deformed due to being subjected to heat or force, the relative positions of the epitaxial structures 120 are not shifted. It should be specifically pointed out that the second substrate 50 and the first substrate 30 may be selected from materials having similar thermal expansion coefficient, for example, both of them may be a sapphire substrate, thereby reducing the effect of deformation caused by the difference in thermal expansion coefficient during the bonding process.

Figure 2E:
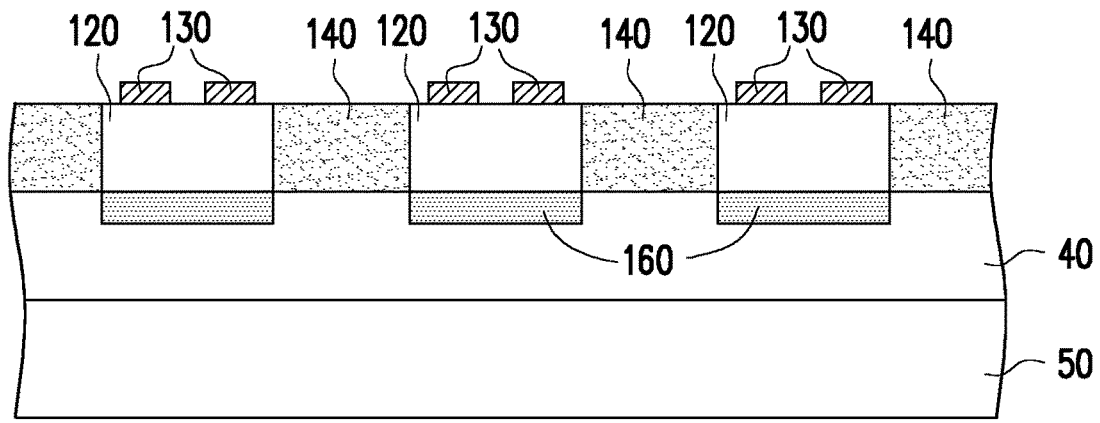

Next, referring to FIG. 2D and FIG. 2E at the sane time, the first substrate 30 and the first adhesive layer 20 are removed to expose the first pads 130 and the plurality of light blocking layers 140. Herein, the first substrate 30 may be removed via the laser lift off process or other proper removing process, and the first adhesive layer 20 may be removed via a laser ablation process, an ultraviolet exposing process, a solution decomposition process or a heat decomposition process, the invention provides no limitation thereto.

Figure 2F:
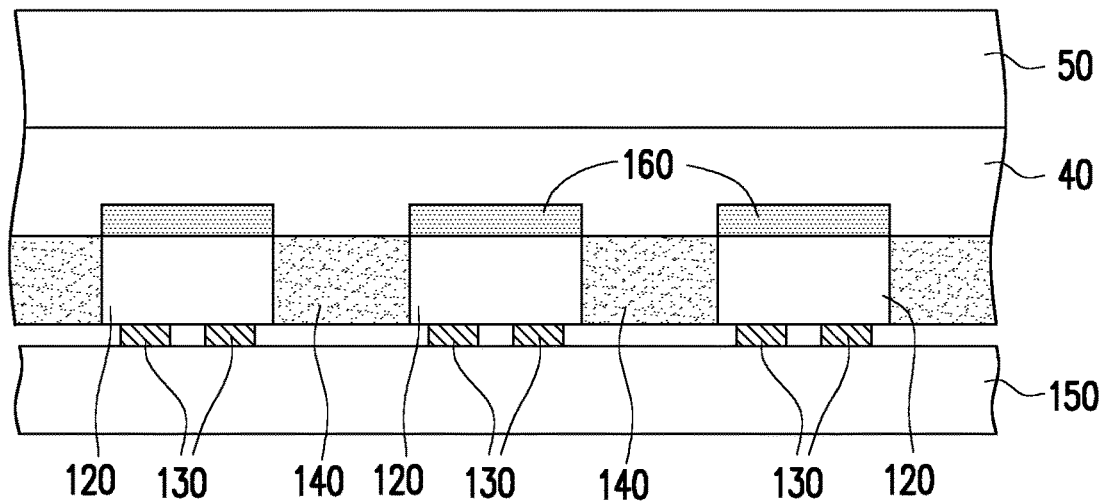

Next, referring to FIG. 2F, each of the epitaxial structures 120 is bonded to the circuit substrate 150 electrically via the corresponding first pad 130, wherein the second substrate 50 and the circuit substrate 150 are respectively disposed on the two opposite sides of the epitaxial structures 120.

Figure 2G:
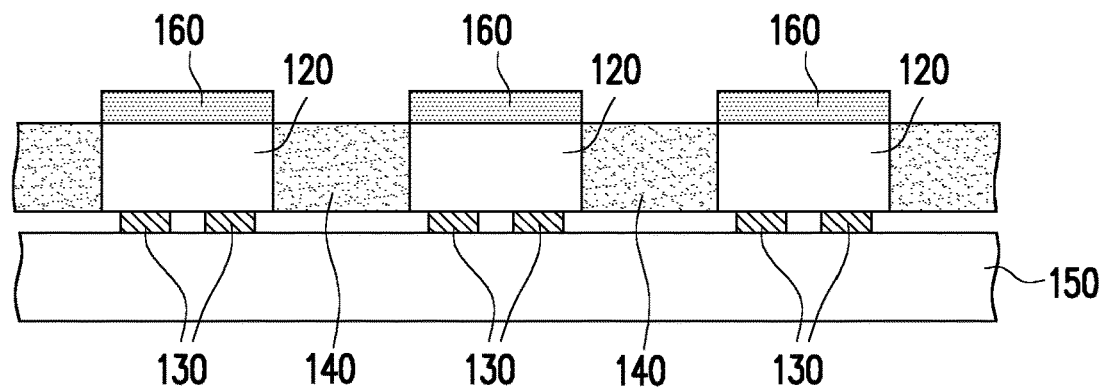

Next, referring to FIG. 2G, the second substrate 50 and the second adhesive layer 40 are removed to expose the connection layer 110a. Herein, the second substrate 50 is removed via a laser lift off process or other proper removing method. Subsequently, the second adhesive layer 40 is removed via a wet-etching process or other proper removing method; the invention provides no limitation thereto. At this point, the manufacturing method of the micro light emitting diode device 100a is completed.

Figure 3A:
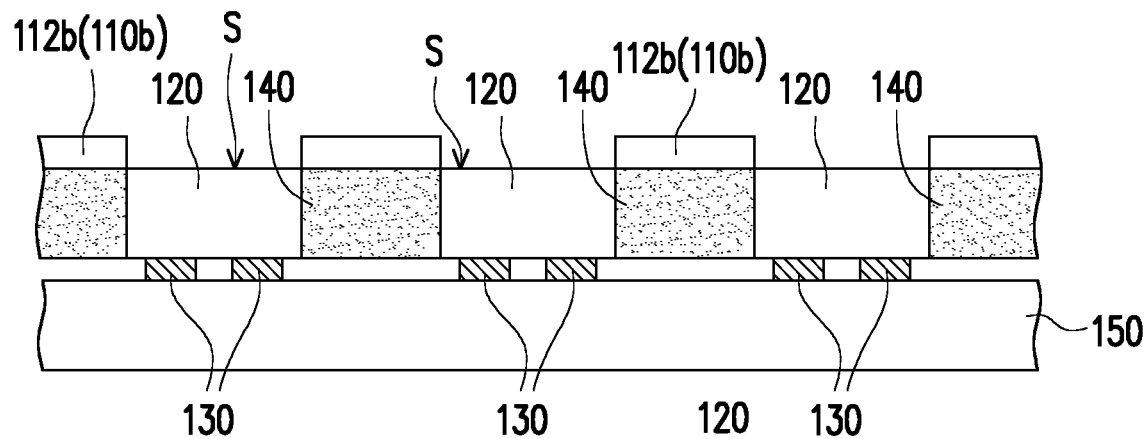
FIG. 3A to FIG. 3B are cross-sectional views illustrating some steps of a manufacturing method of a micro light emitting diode device according to another embodiment of the invention.
Figure 3B:
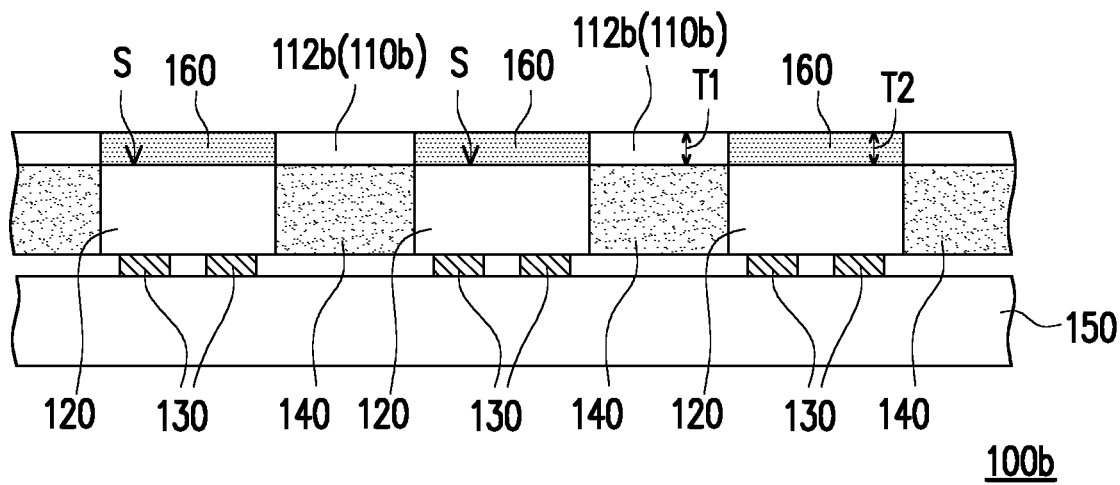

FIG. 3A to FIG. 3B are cross-sectional views illustrating some steps of a manufacturing method of a micro light emitting diode device according to another embodiment of the invention. In the manufacturing process, subsequent to the step of FIG. 1E, referring to FIG. 3A, partially removing the connection layer 110b to expose a surface S of each of the epitaxial structures 120 relative to the first pad 130 and form a plurality of connection portions 112b corresponding the light blocking layers 140, respectively. That is to say, the connection portions 112b are disposed corresponding to the light blocking layers 140. Lastly, referring to FIG. 3B, the light conversion layer 160 is formed corresponding to each of the epitaxial structures 120, wherein the light conversion layer 160 is directly formed on the surface S of each of the epitaxial structures 120. Through this configuration, the light conversion layers can be more accurately placed on the required epitaxial structures 120. Herein, a ratio of a thickness T1 of each of the connection portions 112b to a thickness T2 of each of the light conversion layers 160 is between 0.5 to 1.5. If the above ratio is too small, the light conversion efficiency may be insufficient; if the above ratio is too large, it will affect the production yield of the light conversion layers 160. At this point, the manufacturing method of the micro light emitting diode device 100b is completed.

Figure 4A:
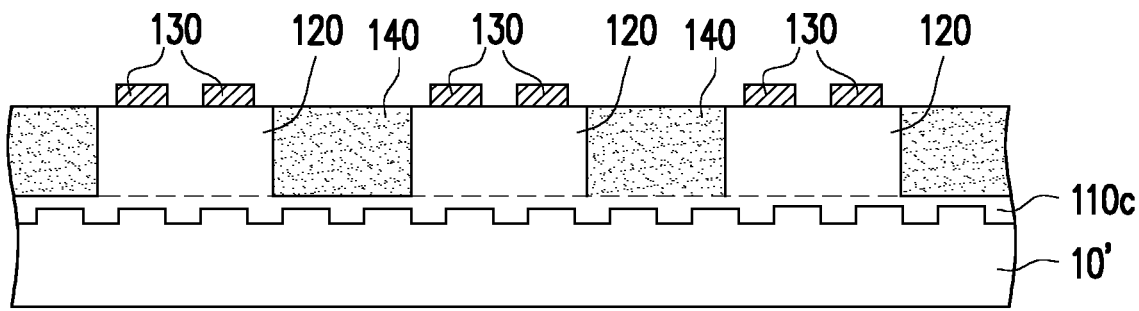
FIG. 4A to FIG. 4C are cross-sectional views illustrating some steps of a manufacturing method of a micro light emitting diode device according to another embodiment of the invention.
Figure 4B:
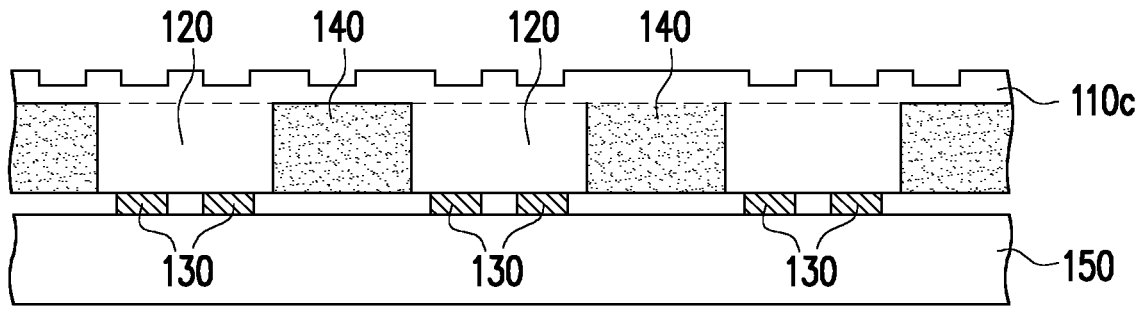
Figure 4C:
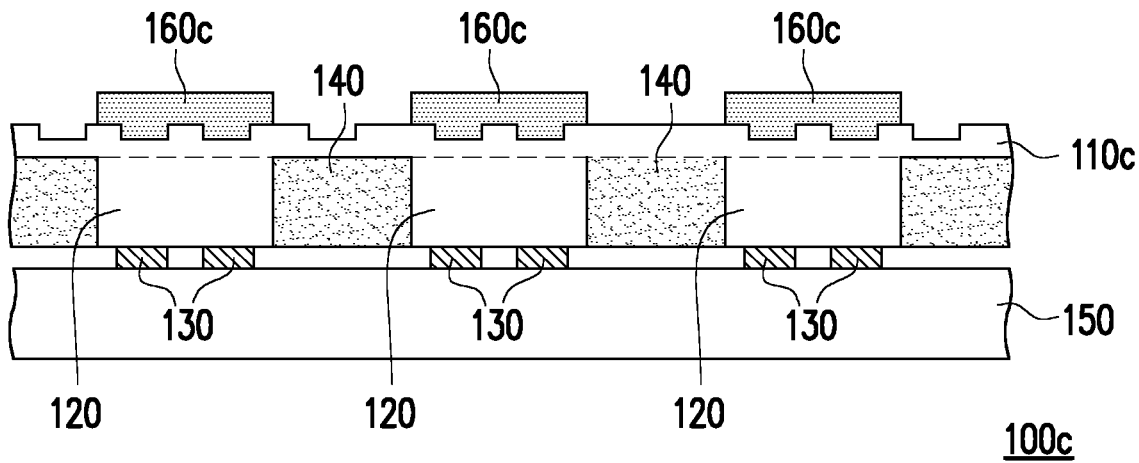

FIG. 4A to FIG. 4C are cross-sectional views illustrating some steps of a manufacturing method of a micro light emitting diode device according to another embodiment of the invention. Referring to FIG. 4A, the substrate 10' is a patterned substrate which is different from the substrate 10 in the previous embodiment. Since the substrate 10' a patterned substrate, the connection layer 110c formed on the substrate 10' is also a patterned connection layer.

Next, referring to FIG. 4B, each of the epitaxial structures 120 is bonded to the circuit substrate 150 electrically via the corresponding first pad 130 after forming the light blocking layers 140, and then the substrate 10' is removed to expose the connection layer 110c.

Lastly, referring to FIG. 4C, the light conversion layer 160c is formed corresponding to each of the epitaxial structures 120, wherein the light conversion layer 160c is directly formed on the connection layer 110c. Herein, the contact surface between the light conversion layer 160c and the connection layer 110c is an uneven surface. At this point, the manufacturing method of the micro light emitting diode device 100c is completed. Through the patterned design, the light emission efficiency can be batter. In particular, the connection layer 110 can also be configured without the entire surface.

Figure 5:
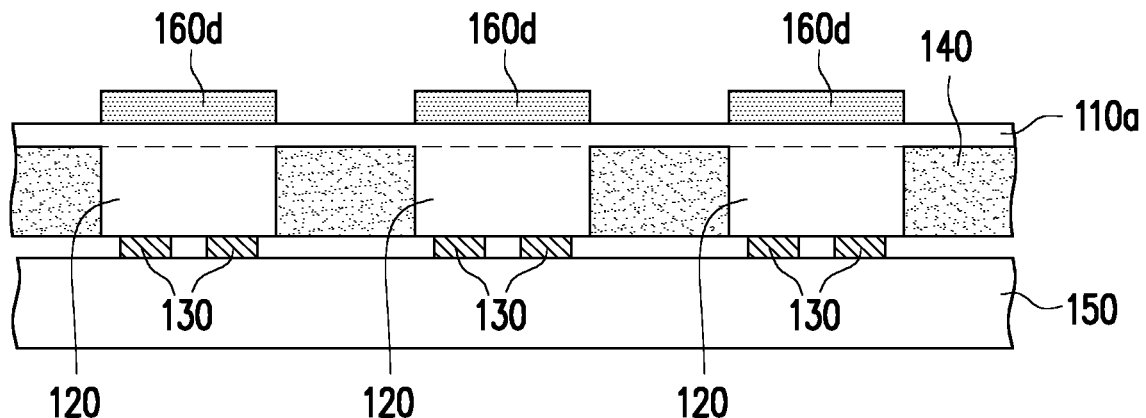
FIG. 5 is a schematic cross-sectional view of a micro light emitting diode device according to an embodiment of the invention.

FIG. 5 is a schematic cross-sectional view of a micro light emitting diode device according to an embodiment of the invention. In the manufacturing process, subsequent to the step of FIG. 1E, referring to FIG. 5, the light conversion layer 160 corresponding to each of the epitaxial structures 120 is directly formed on the connection layer 110a. The connection layer 110a is disposed on the light blocking layers 140 and the epitaxial structures 120, wherein the light conversion layers 160 corresponding to each of the epitaxial structures 120 are disposed on the connection layer 110a. That is to say, in this embodiment, the connection layer 110a is retained, so that the light conversion layer 160 can be batter fabricated. At this point, the manufacturing method of the micro light emitting diode device 100d is completed.

Figure 6:
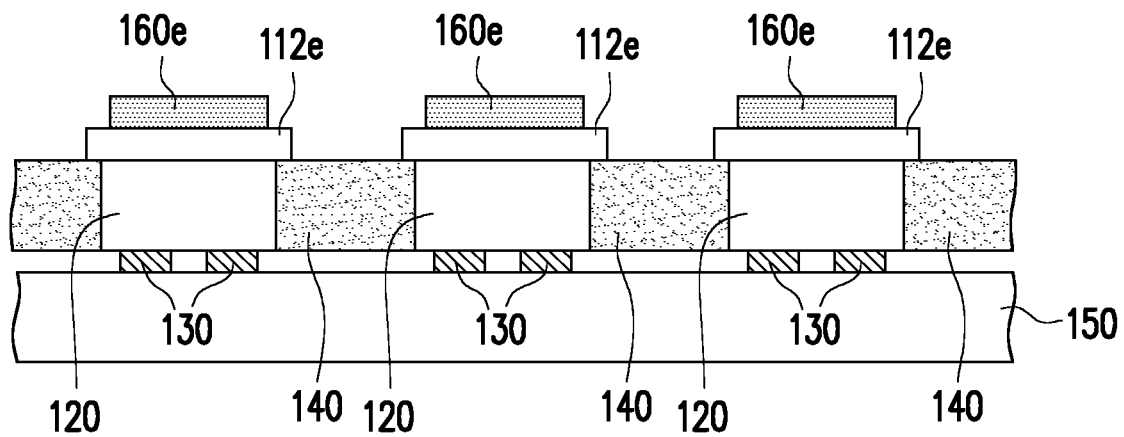
FIG. 6 is a schematic cross-sectional view of a micro light emitting diode device according to another embodiment of the invention.

FIG. 6 is a schematic cross-sectional view of a micro light emitting diode device according to another embodiment of the invention. In the manufacturing process, subsequent to the step of FIG. 1E, referring to FIG. 1E and FIG. 6, partially removing the connection layer 110a to expose a portion of each of the light blocking layers 140 and form a plurality of connection portions 112f corresponding the epitaxial structures 120, respectively, wherein the light conversion layer 160 corresponding to each of the epitaxial structures 120 is directly formed on each of the connection portions 112f. That is to say, the connection portions 112f are disposed corresponding to the epitaxial structures 120 and extending to a portion of each of the light blocking layers 140. Herein, an orthographic projection of each of the light conversion layers 160 on the circuit substrate 150 completely overlaps an orthographic projection of each of the corresponding epitaxial structures 120 on the circuit substrate 150. In this embodiment, the connection portions 112f can be used as a platform for manufacturing the light conversion layer 160, and can have a batter manufacturing process yield. At this point, the manufacturing method of the micro light emitting diode device 100e is completed.

Figure 7A:
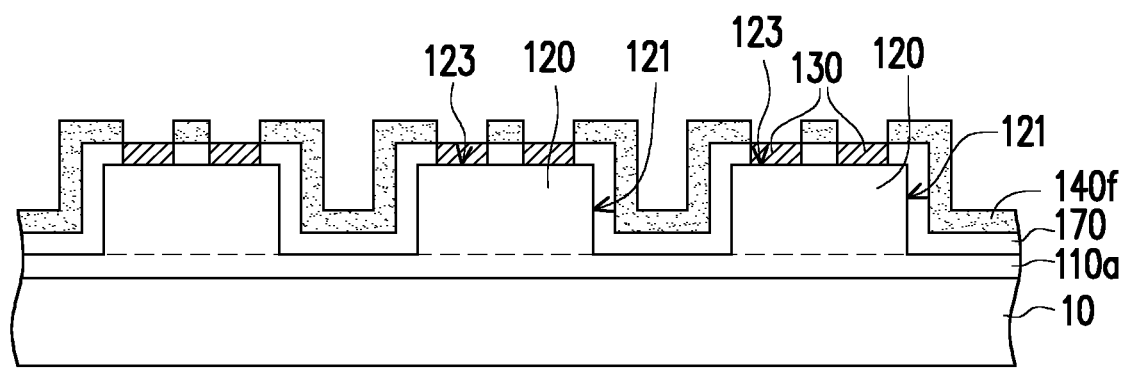
FIG. 7A to FIG. 7C are cross-sectional views illustrating some steps of a manufacturing method of a micro light emitting diode device according to another embodiment of the invention.
Figure 7B:
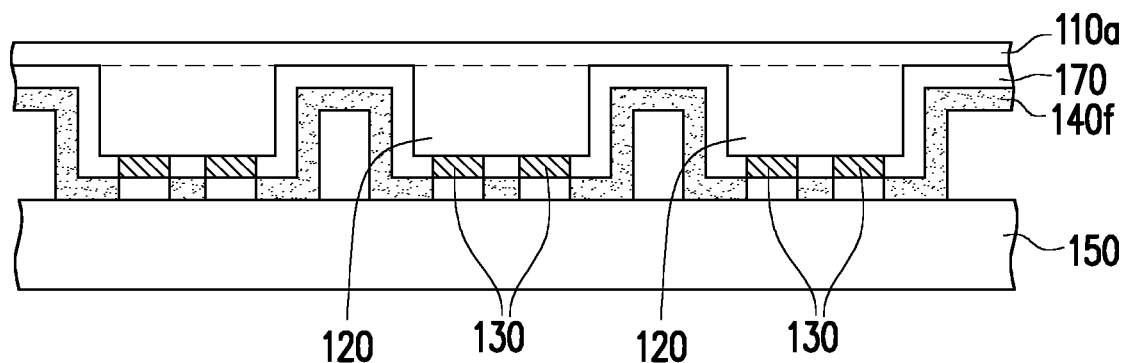
Figure 7C:
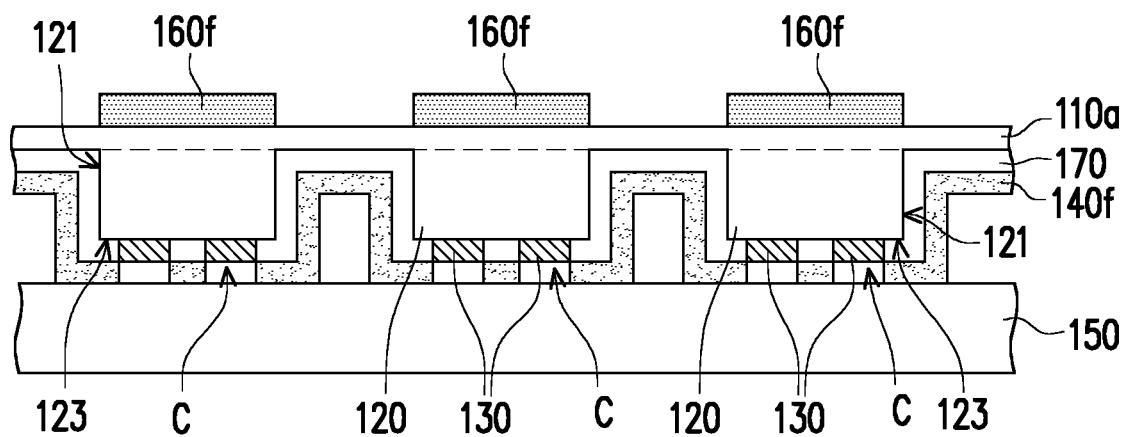

FIG. 7A to FIG. 7C are cross-sectional views illustrating some steps of a manufacturing method of a micro light emitting diode device according to another embodiment of the invention. In the manufacturing process, subsequent to the step of FIG. 1B, referring to FIG. 7A, an insulating layer 170 is formed on a side wall surface 121 and a bonding surface 123 connected to each other of each of the epitaxial structures 120 and the connection layer 110a. Next, referring to FIG. 7A again, a light blocking layer 140f is formed on the insulating layer 170, wherein the light blocking layer 140f expose the first pad 130 of each of the epitaxial structures 120. That is, there is a groove between each first pad 130 and the light blocking layer 140f, which can be used as a space for subsequent bonding to the circuit substrate 150. Herein, a material of the light blocking layer 140f is a metal with good reflectivity.

Next, referring to FIG. 7A and FIG. 7B, each of the epitaxial structures 120 is bonded to the circuit substrate 150 electrically via the corresponding first pad 130 after forming the light blocking layer 140f. And then, the substrate 10 is removed to expose the connection layer 110a. Herein, the first pad 130 of each of the epitaxial structures 120, the light blocking layer 140 and the circuit substrate 150 define a cavity C. Herein, the electrical connection between the first pad 130 and the circuit substrate 150 can pass through the conductive adhesive such as ACF (Anisotropic Conductive Film). Because ACF is connected only when the pressure is vertical, it will not cause a short circuit between the first pad 130 and the metal light blocking layer 140f. However, the light blocking layer 140f can also be insulated which is not limited here. Lastly, referring to FIG. 7C, the light conversion layer 160f is formed corresponding to each of the epitaxial structures 120 on the connection layer 110a. At this point, the manufacturing method of the micro light emitting diode device 100f is completed.

In terms of structure, further referring to FIG. 7C, the micro light emitting diode device 100f includes the circuit substrate 150, the epitaxial structures 120, the first pads 130, the insulating layer 170, the light blocking layer 140f and the light conversion layers 160f. The epitaxial structures 120 are disposed on the circuit substrate 150 and separated from each other. The first pads 130 are respectively disposed on the epitaxial structures 120, and each of the epitaxial structures 120 is electrically bonded to the circuit substrate 150 via the corresponding first pads 130. The insulating layer 170 is disposed on the side wall surface 121 and the bonding surface 123 connected to each other of each of the epitaxial structures 120. The light blocking layer 140f is disposed on the insulating layer 170, wherein the light blocking layer 170 expose the first pads 130. The light conversion layers 160f is disposed corresponding to the epitaxial structures 120. Herein, the first pads 130, the light blocking layer 140 and the circuit substrate 150 define a plurality of cavities C. Herein, the cavities C can be used as a buffer space when the first pads 130 and the circuit substrate 150 are bonded to avoid short circuit caused by overflow.

In summary, in the manufacturing process of the micro light emitting diode device of the invention, the relative positions of the epitaxial structures on the substrate (e.g., growth substrate) are fixed via the connection layer. Therefore, when the epitaxial structures are bonded to the circuit substrate, the pad on each of the epitaxial structures can be precisely aligned with an electrode bonding layer on the circuit substrate. Furthermore, the light blocking layers are formed before bonding the epitaxial structures to the circuit substrate. Therefore, the accuracy and stress relief during the transfer can be increased, and the light blocking layers are not needed after the transfer, which can increase the yield. In other words, the manufacturing method of the micro light emitting diode device in the invention facilitates to improve manufacturing efficiency and yield of rate, and the obtained micro light emitting diode device can have better reliability.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a micro light emitting diode device, comprising:
forming a connection layer and a plurality of epitaxial structures on a substrate, wherein the plurality of epitaxial structures are separated from each other and relative positions therebetween are fixed via the connection layer;
forming a first pad on each of the plurality of epitaxial structures, wherein the first pad and the connection layer are respectively located on two opposite sides of each of the plurality of epitaxial structures;

forming a plurality of light blocking layers between the plurality of epitaxial structures, wherein the plurality of light blocking layers and the plurality of epitaxial structures are alternately arranged;

bonding the plurality of epitaxial structures and the plurality of light blocking layers alternately arranged with the plurality of epitaxial structures to a destination substrate after forming the plurality of light blocking layers, wherein the substrate and the destination substrate are respectively disposed on the two opposite sides of the plurality of epitaxial structures;

removing the substrate to expose the connection layer; and forming a light conversion layer corresponding to each of the plurality of epitaxial structures, wherein a width of the light conversion layer is greater than or equal to a distance between any two of the plurality of light blocking layers.

2. The manufacturing method of the micro light emitting diode device according to claim 1, further comprising:
before forming the light conversion layer, completely removing the connection layer, wherein the light conversion layer is directly formed on each of the plurality of epitaxial structures.

3. The manufacturing method of the micro light emitting diode device according to claim 1, further comprising:
before forming the light conversion layer, partially removing the connection layer to expose a surface of each of the plurality of epitaxial structures relative to the first pad and form a plurality of connection portions corresponding the plurality of light blocking layers, respectively, wherein the light conversion layer is directly formed on the surface of each of the plurality of epitaxial structures.

4. The manufacturing method of the micro light emitting diode device according to claim 3, wherein a ratio of a thickness of each of the plurality of connection portions to a thickness of each of the plurality of light conversion layers is between 0.5 to 1.5.

5. The manufacturing method of the micro light emitting diode device according to claim 1, wherein the substrate is a patterned substrate, the connection layer exposed after removing the substrate is a patterned connection layer, and the light conversion layer corresponding to each of the plurality of epitaxial structures is directly formed on the patterned connection layer.

6. The manufacturing method of the micro light emitting diode device according to claim 1, wherein the light conversion layer corresponding to each of the plurality of epitaxial structures is directly formed on the connection layer.

7. The manufacturing method of the micro light emitting diode device according to claim 1, further comprising:
before forming the light conversion layer, partially removing the connection layer to expose a portion of each of the plurality of light blocking layers and form a plurality of connection portions corresponding the plurality of epitaxial structures, respectively, wherein the light conversion layer corresponding to each of the plurality of epitaxial structures is directly formed on each of the plurality of connection portions.

8. The manufacturing method of the micro light emitting diode device according to claim 1, further comprising:
after forming the plurality of light blocking layers, and before bonding each of the plurality of epitaxial structures to the destination substrate, forming a first adhesive layer on the plurality of light blocking layers, wherein the first adhesive layer covers the plurality of epitaxial structures and the first pad;

connecting a first substrate with the first adhesive layer, wherein the first substrate and the substrate are respectively located on two opposite sides of the first adhesive layer;

removing the substrate, and connecting a second substrate with the epitaxial structures via a second adhesive layer, wherein the first substrate and the second substrate are respectively disposed on the two opposite sides of the first adhesive layer;

removing the first substrate and the first adhesive layer to expose the first pad and the plurality of light blocking layers;

bonding each of the epitaxial structures to the destination substrate, and the second substrate and the destination substrate are respectively disposed on the two opposite sides of the plurality of epitaxial structures; and removing the second substrate and the second adhesive layer.

9. A manufacturing method of a micro light emitting diode device, comprising:
forming a connection layer and a plurality of epitaxial structures on a substrate, wherein the plurality of epitaxial structures are separated from each other and relative positions therebetween are fixed via the connection layer;

forming a first pad on each of the plurality of epitaxial structures, wherein the first pad and the connection layer are respectively located on two opposite sides of each of the plurality of epitaxial structures;

forming an insulating layer on a side wall surface and a bonding surface connected to each other of each of the plurality of epitaxial structures and the connection layer;

forming a light blocking layer on the insulating layer, wherein the light blocking layer expose the first pad of each of the plurality of epitaxial structures;

bonding each of the plurality of epitaxial structures to a destination substrate after forming the light blocking layer, wherein the substrate and the destination substrate are respectively disposed on the two opposite sides of the plurality of epitaxial structures;

removing the substrate to expose the connection layer; and forming a light conversion layer corresponding to each of the plurality of epitaxial structures.

10. The manufacturing method of the micro light emitting diode device according to claim 9, wherein the first pad of each of the plurality of epitaxial structures, the light blocking layer and the destination substrate define a cavity.

11. A micro light emitting diode device, comprising:
a circuit substrate;
a plurality of epitaxial structures, disposed on the circuit substrate and separated from each other;
a plurality of first pads, respectively disposed on the plurality of epitaxial structures, and each of the plurality of epitaxial structures is electrically bonded to the circuit substrate via the corresponding first pad;
a plurality of light blocking layers, disposed between the plurality of epitaxial structures, wherein the plurality of light blocking layers and the plurality of epitaxial structures are alternately arranged, and the plurality of first pads, the plurality of light blocking layers and the circuit substrate define a plurality of air spaces; and
a plurality of light conversion layers, disposed corresponding to the plurality of epitaxial structures, wherein a width of each of the plurality of light conversion layers is greater than or equal to a distance between any two of the plurality of light blocking layers.

12. The micro light emitting diode device according to claim 11, further comprising:
a plurality of connection portions, disposed corresponding to the plurality of light blocking layers.

13. The micro light emitting diode device according to claim 12, wherein a ratio of a thickness of each of the plurality of connection portions to a thickness of each of the plurality of light conversion layers is between 0.5 to 1.5.

14. The micro light emitting diode device according to claim 11, further comprising:
a connection layer, disposed on the plurality of light blocking layers and the plurality of epitaxial structures, wherein the plurality of light conversion layers are disposed on the connection layer.

15. The micro light emitting diode device according to claim 14, wherein the connection layer is a patterned connection layer.

16. The micro light emitting diode device according to claim 11, further comprising:
a plurality of connection portions, disposed corresponding to the plurality of epitaxial structures and extending to a portion of each of the plurality of light blocking layers.

17. The micro light emitting diode device according to claim 11, wherein two opposite surfaces of each of the plurality of light blocking layers are respectively aligned with two opposite surfaces of each of the plurality of epitaxial structures.

18. A micro light emitting diode device, comprising:
a circuit substrate;
a plurality of epitaxial structures, disposed on the circuit substrate and separated from each other;
a plurality of first pads, respectively disposed on the plurality of epitaxial structures, and each of the plurality of epitaxial structures is electrically bonded to the circuit substrate via the corresponding first pad;
an insulating layer, disposed on a side wall surface and a bonding surface connected to each other of each of the epitaxial structures;
a light blocking layer, disposed on the insulating layer, wherein the light blocking layer expose the plurality of first pads; and
a plurality of light conversion layers, disposed corresponding to the plurality of epitaxial structures.

19. The micro light emitting diode device according to claim 18, wherein the first pads, the light blocking layer and the circuit substrate define a plurality of cavities.

* * * * *